United States Patent [19]

Nakata et al.

[11] Patent Number: 5,530,411
[45] Date of Patent: Jun. 25, 1996

[54] LAMINATE TYPE LC COMPOSITE DEVICE HAVING A MICRO COIL

[75] Inventors: Yasuhiro Nakata; Hiromichi Tokuda; Toshimi Kaneko; Yukio Sakamoto, all of Nagaokakyo, Japan

[73] Assignee: Murata Manufacturing Co., Ltd., Nagaokakyo, Japan

[21] Appl. No.: 361,527

[22] Filed: Dec. 22, 1994

[30] Foreign Application Priority Data

Dec. 28, 1993 [JP] Japan ................................. 5-334436

[51] Int. Cl.$^6$ ..................................................... H03H 7/00
[52] U.S. Cl. ................................................. 333/185; 333/219
[58] Field of Search ................................. 333/185, 219

[56] References Cited

U.S. PATENT DOCUMENTS

| | | | |
|---|---|---|---|
| 4,845,452 | 7/1989 | Sasaki et al. | 333/185 X |
| 5,197,170 | 3/1993 | Senda et al. | 333/185 X |
| 5,357,227 | 10/1994 | Tonegawa et al. | 333/185 |

FOREIGN PATENT DOCUMENTS 582344   4/1993   Japan ................................. 333/185

*Primary Examiner*—Benny Lee
*Assistant Examiner*—Justin P. Bettendorf
*Attorney, Agent, or Firm*—Burns, Doane, Swecker & Mathis

[57] ABSTRACT

A laminate type LC composite device has a coil connected in series between an input electrode and an output electrode, and a capacitor connected in parallel between the input electrode and the output electrode. Further, a micro coil is connected to the coil in series. The coil has an inductance of L and a stray capacitance of C, and the micro coil has an inductance of L' and a stray capacitance of C'. The inductances L and L', and the stray capacitances C and C' fulfill the conditions: LC>L'C', to thereby increase the high-frequency characteristics and the insertion loss in a high frequency area of the LC composite device.

15 Claims, 12 Drawing Sheets

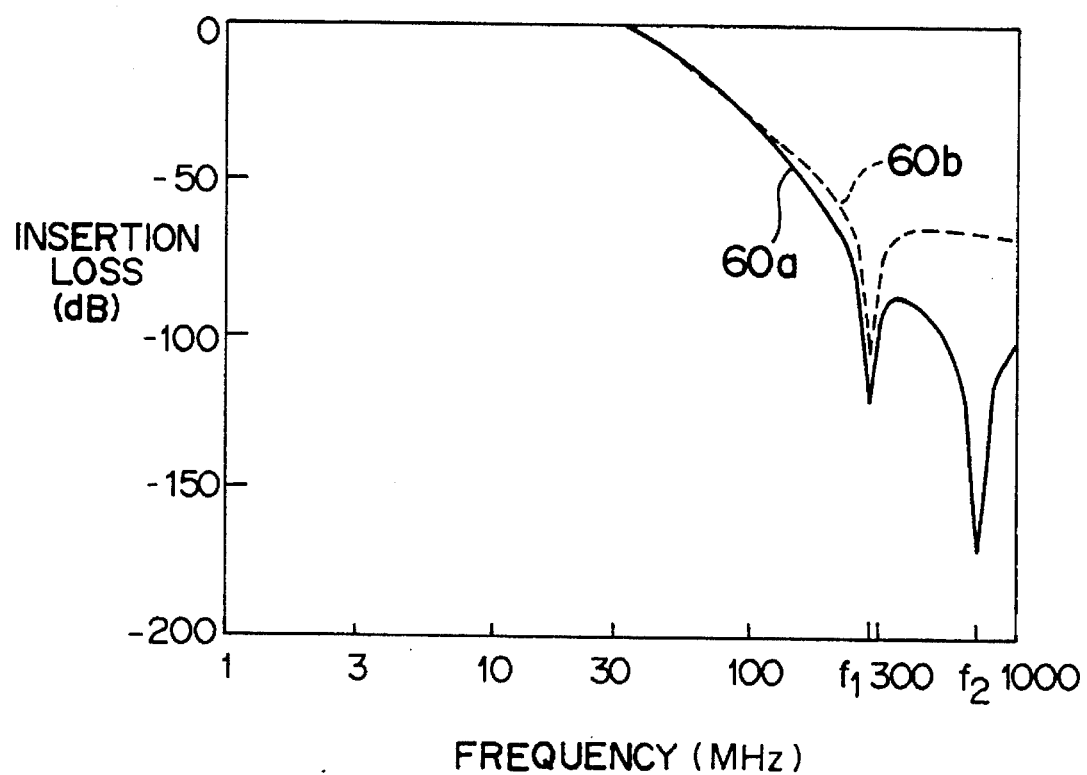
F I G. 8

LAMINATE TYPE LC COMPOSITE DEVICE HAVING A MICRO COIL

BACKGROUND OF THE INVENTION

1. Field of the Invention

The present invention relates to a laminate type LC composite device, and more particularly, to a laminate type LC composite device which is used for a filter circuit.

2. Description of Related Art

FIGS. 15 and 16 show LC composite devices of prior art. FIG. 15 is an electric equivalent circuit diagram of a T type LC filter. In this LC filter, between an input electrode 67 and an output electrode 68, coils 62 and 63 are connected in series, and a capacitor 64 is connected in parallel. Stray capacitances of $C_{10}$ are generated in parallel with the coils 62 and 63 respectively. Numeral 69 denotes a grounding electrode.

FIG. 16 is an electric equivalent circuit diagram of a $\pi$ type LC filter. In this LC filter, between an input electrode 77 and an output electrode 78, a coil 72 is connected in series, and capacitors 73 and 74 are connected in parallel. A stray capacitance of $C_{11}$ is generated in parallel with the coil 72. Numerals 79a and 79b denote grounding electrodes.

In these T type and $\pi$ type LC filters, the inductance and the stray capacitance $C_{10}$ of the coil 62, the inductance and the stray capacitance $C_{10}$ of the coil 63, and the inductance and the stray capacitance $C_{11}$ of the coil 72 resonate respectively. In a high-frequency area having frequencies above the resonance frequency, the noise eliminating function of the coils 62, 63 and 72 becomes weak, and noise currents flowing in the stray capacitances $C_{10}$ and $C_{11}$ increase. Thus, these LC filters have a disadvantage that in a high-frequency area over the resonance frequency, the noise eliminating function becomes weak because of a small insertion loss.

SUMMARY OF THE INVENTION

An object of the present invention is to provide a laminate type LC composite filter which excels in high-frequency characteristics.

In order to attain the object, a laminate type LC composite device according to the present invention has a micro coil which is connected to a coil in series. The coil has an inductance of L and a stray capacitance of C, and the micro coil has an inductance of L' and a stray capacitance of C'. The inductances L and L' and the stray capacitances C and C' fulfill the condition, $LC>L'C'$.

The LC composite device has a first resonance frequency and a second resonance frequency. At the first resonance frequency, the inductance of the coil and the stray capacitance generated in parallel with the coil resonate, and at the second resonance frequency, the inductance of the micro coil and the stray capacitance generated in parallel with the micro coil resonate. Because the inductance L of the coil is larger than the inductance L' of the micro coil, the second resonance frequency is higher than the first resonance frequency. Therefore, even in a high-frequency area having frequencies above the first resonance frequency, the micro coil functions to eliminate noise, and a large insertion loss can be maintained. Thus, this LC composite device is better in the high-frequency characteristics than conventional LC composite devices.

BRIEF DESCRIPTION OF THE DRAWINGS

This and other objects and features of the present invention will be apparent from the following description with reference to the accompanying drawings, in which:

FIG. 8 is a graph showing the insertion loss characteristic of the laminate type LC composite device of FIG. 6;

DETAILED DESCRIPTION OF THE PREFERRED EMBODIMENTS

Preferred embodiments of the present invention are described with reference to the accompanying drawings.

First Embodiment: FIGS. 1-4

Figure 1:
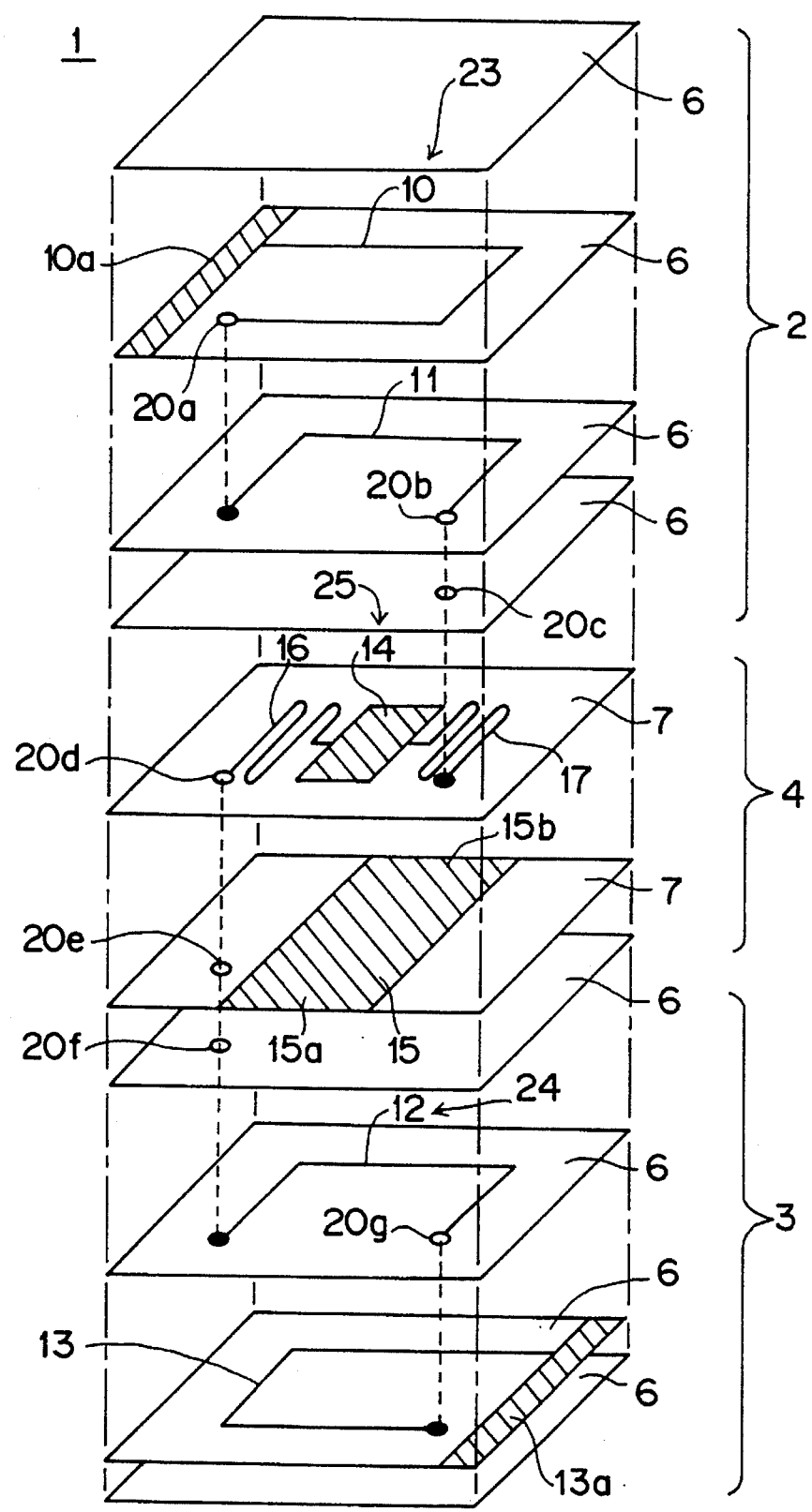
FIG. 1 is an exploded perspective view of a laminate type LC composite device which is a first embodiment of the present invention.

A first embodiment is a T type low-pass filter 1. As shown in FIG. 1, the filter 1 has a capacitor section 4 between inductor sections 2 and 3. The inductor section 2 comprises a plurality of insulating sheets 6 and coil conductors 10 and 11, and the inductor section 3 comprises a plurality of insulating sheets 6 and coil conductors 12 and 13. The insulating sheets 6 are made of a material with a high magnetic permeability, for example, ferrite.

The coil conductors 10 through 13, which are provided on the insulating sheets 6, can be made by screen printing, sputtering or vapor deposition of Ag, Ag—Pd, Cu or the like. The coil conductor 10 extends a leading portion 10a to the left edge of an insulating sheet 6, and the coil conductor 13 extends a leading portion 13a to the right edge of an insulating sheet 6.

The capacitor section 4 comprises a plurality of insulating sheets 7, and capacitor conductors 14 and 15 and micro coils 16 and 17 which are provided on the insulating sheets 7. The insulating sheets 7 are made of a material with a low magnetic permeability, for example, ceramics such as barium titanate. The capacitor conductor 14 and the micro coils 16 and 17 are provided on an insulating sheet 7. Accordingly, insulating sheets 7 exclusively for the micro coils 16 and 17 are not necessary, and the filter 1 does not become large-sized. The micro coils 16 and 17 are snaking coils each of which has an inductance of $L_2$, and are electrically connected to each other via the capacitor conductor 14. The capacitor conductor 15 extends leading portions 15a and 15b respectively to the front edge and to the rear edge of an insulating sheet 7. The conductors 14 and 15, and the micro coils 16 and 17 are made by the same method as the coils 10 through 13. The insulating sheets 6 and 7 have via holes 20a through 20g.

The insulating sheets 6 and 7 which have the conductors 10 through 15 and the micro coils 16 and 17 thereon, and a protective insulating sheet 6 which has nothing thereon are laminated and sintered. In the laminate structure, the coil conductors 10 and 11 are connected in series by the via hole 20a to form a spiral coil 23 with an inductance of $L_1$. The coil conductors 12 and 13 are connected in series by the via hole 20g to form a spiral coil 24 with an inductance of $L_1$. The inductances $L_2$ of the coils 23 and 24 and the inductances $L_2$ of the micro coils 16 and 17 fulfill the following condition:

$$L_1C_2 > L_2C_3 \quad (1)$$

$C_2$: stray capacitances of the coils 23 and 24
$C_3$: stray capacitances of the micro coils 16 and 17

The capacitor conductors 14 and 15 form a capacitor 25 with a capacitance of $C_1$. The spiral coil 23 is connected to the micro coil 17 in series by the via holes 20b and 20c, and the spiral coil 24 is connected to the micro coil 16 in series by the via holes 20d through 20f.

Figure 2:
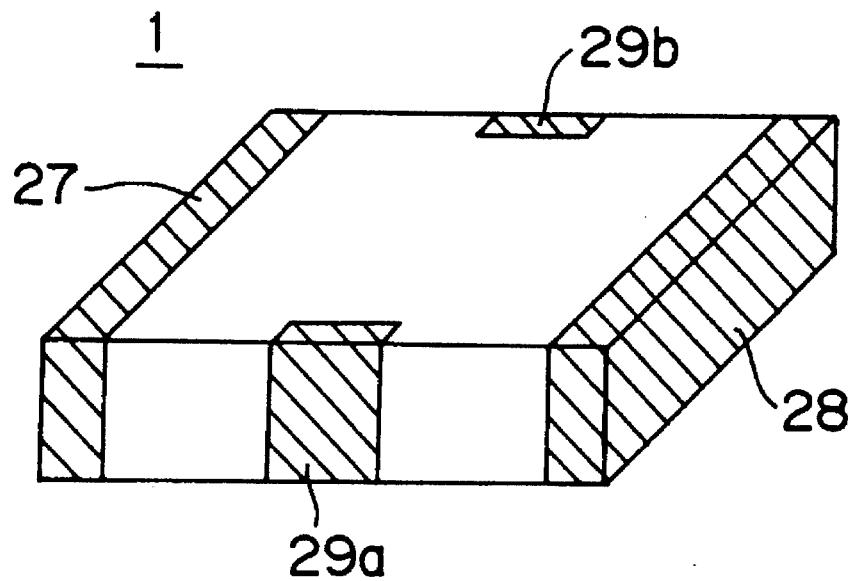
FIG. 2 is a perspective view of the laminate type LC composite device of FIG. 1.

As shown in FIG. 2, the filter 1 is provided with an input electrode 27 and an output electrode 28 on the left end and on the right end respectively. Further, the filter 1 is provided with grounding electrodes 20a and 20b on the front end and on the rear end respectively. The input electrode 27 is electrically connected to the leading portion 10a of the coil-conductor 10, and the output electrode 28 is electrically connected to the leading portion 13a of the coil conductor 13. The grounding electrodes 20a and 20b are electrically connected respectively to the leading portions 15a and 15b of the capacitor electrode 15. The electrodes 27 through 20b can be made by coating, sputtering, ion plating or vapor deposition of Ag, Ag—Pd or the like.

Figure 3:
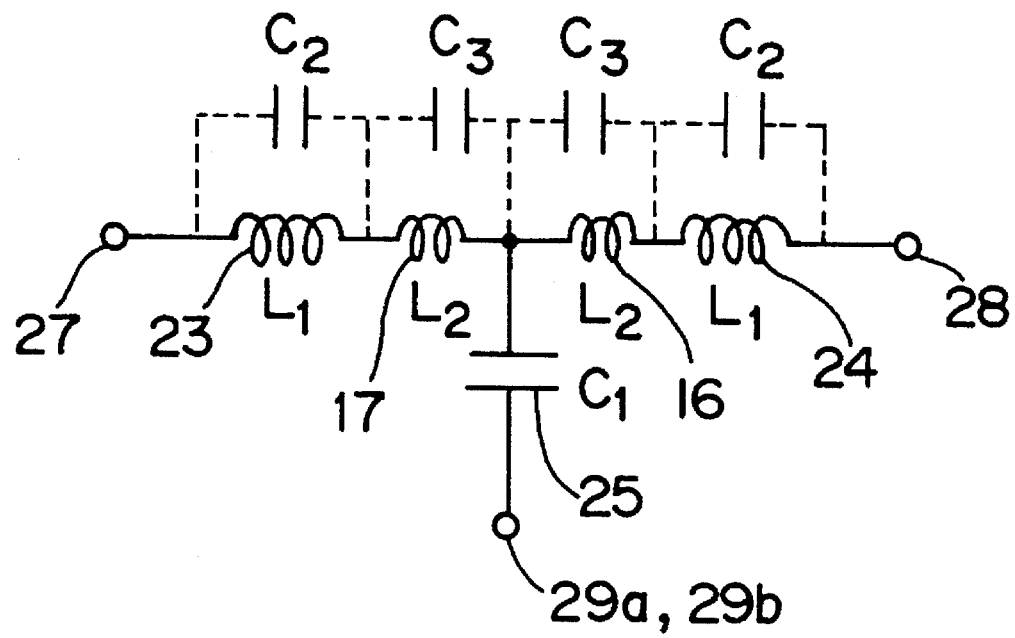
FIG. 3 is an electric equivalent circuit diagram of the laminate type LC composite device of FIG. 2.

FIG. 3 shows the electric equivalent circuit of the filter 1. Between the input electrode 27 and the output electrode 28, the coils 23 and 24 and the micro coils 16 and 17 are connected in series, and the capacitor 25 is connected in parallel. Stray capacitances of $C_2$ are generated in parallel with the coils 23 and 24 respectively. Stray capacitances of $C_3$ are generated in parallel with the micro coils 16 and 17.

The inductance $L_1$ and the stray capacitance $C_2$ of the coil 23, and the inductance $L_2$ and the stray capacitance $C_2$ of the coil 24 resonate respectively at a resonance frequency of $f_1$. The inductance $L_2$ and the stray capacitance $C_3$ of the micro coil 16, and the inductance $L_2$ and the stray capacitance $C_3$ of the micro coil 17 resonate respectively at a resonance frequency of $f_2$.

Because of the condition of the above expression (1), the resonance frequency $f_2$ is higher than the resonance frequency $f_1$. In a frequency area under the resonance frequency $f_1$, the coils 23 and 24 function to eliminate noise, and in a frequency area having frequencies above the resonance frequency $f_1$, the micro coils 16 and 17 function to eliminate noise. Thus, the filter 1 has better high-frequency characteristics than conventional LC composite devices.

Figure 4:
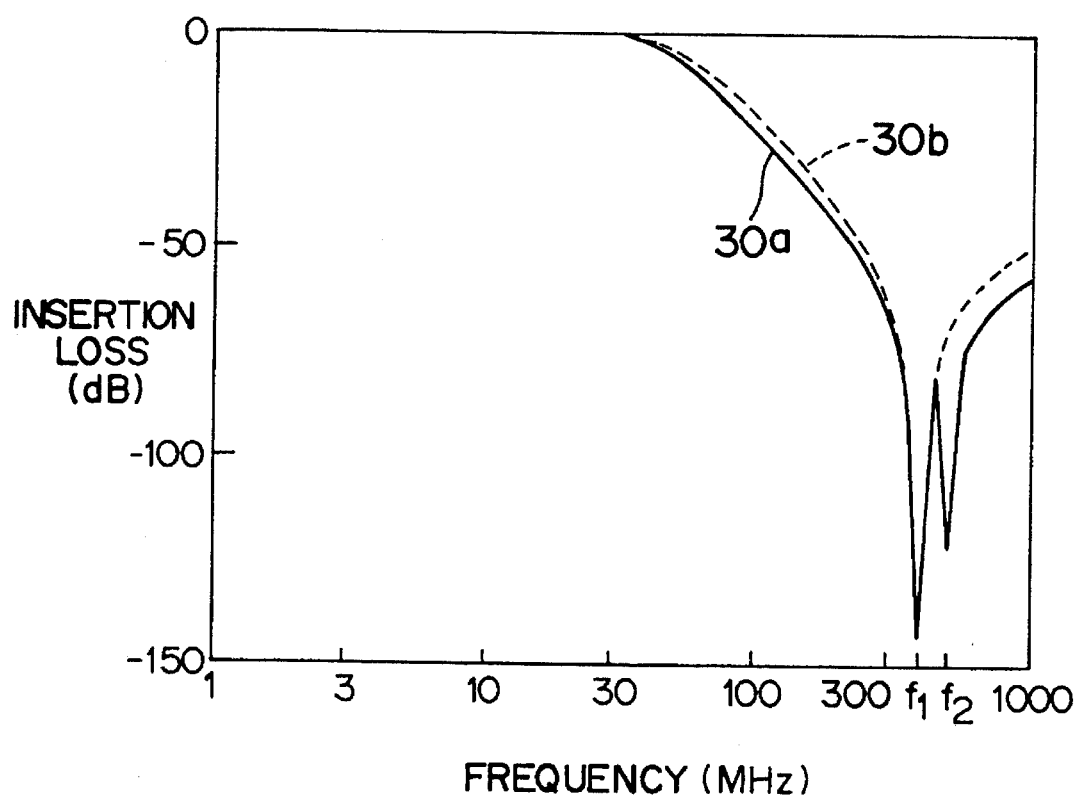
FIG. 4 is a graph showing the insertion loss characteristic of the laminate type LC composite device of FIG. 2.

FIG. 4 shows the insertion loss characteristic of the filter 1. The solid line 30a shows the insertion loss characteristic of the filter 1, wherein the inductances $L_1$ of the coils 23 and 24 are 159 nH, the inductances $L_2$ of the micro coils 16 and 17 are 10 nH, the capacitance $C_1$ of the capacitor is 128 pF, the stray capacitances $C_2$ of the coils 23 and 24 are 1 pF, and the stray capacitances $C_3$ of the micro coils 16 and 17 are 2 pF. For comparison, the dashed line 30b shows the insertion loss characteristic of a conventional filter, wherein the micro coils 16 and 17 are not provided, and accordingly the stray capacitances $C_3$ are not generated. The resonance frequency $f_2$ of the inductances $L_2$ and the stray capacitances $C_3$ of the micro coils 16 and 17 higher than the resonance frequency $f_1$ of the inductances $L_1$ and the stray capacitances $C_2$ of the coils 23 and 24. As is apparent from FIG. 4, in a high-frequency area, the filter 1 has a larger insertion loss than conventional filters and better in the noise elimination function.

Second Embodiment: FIGS. 5–8

Figure 5:
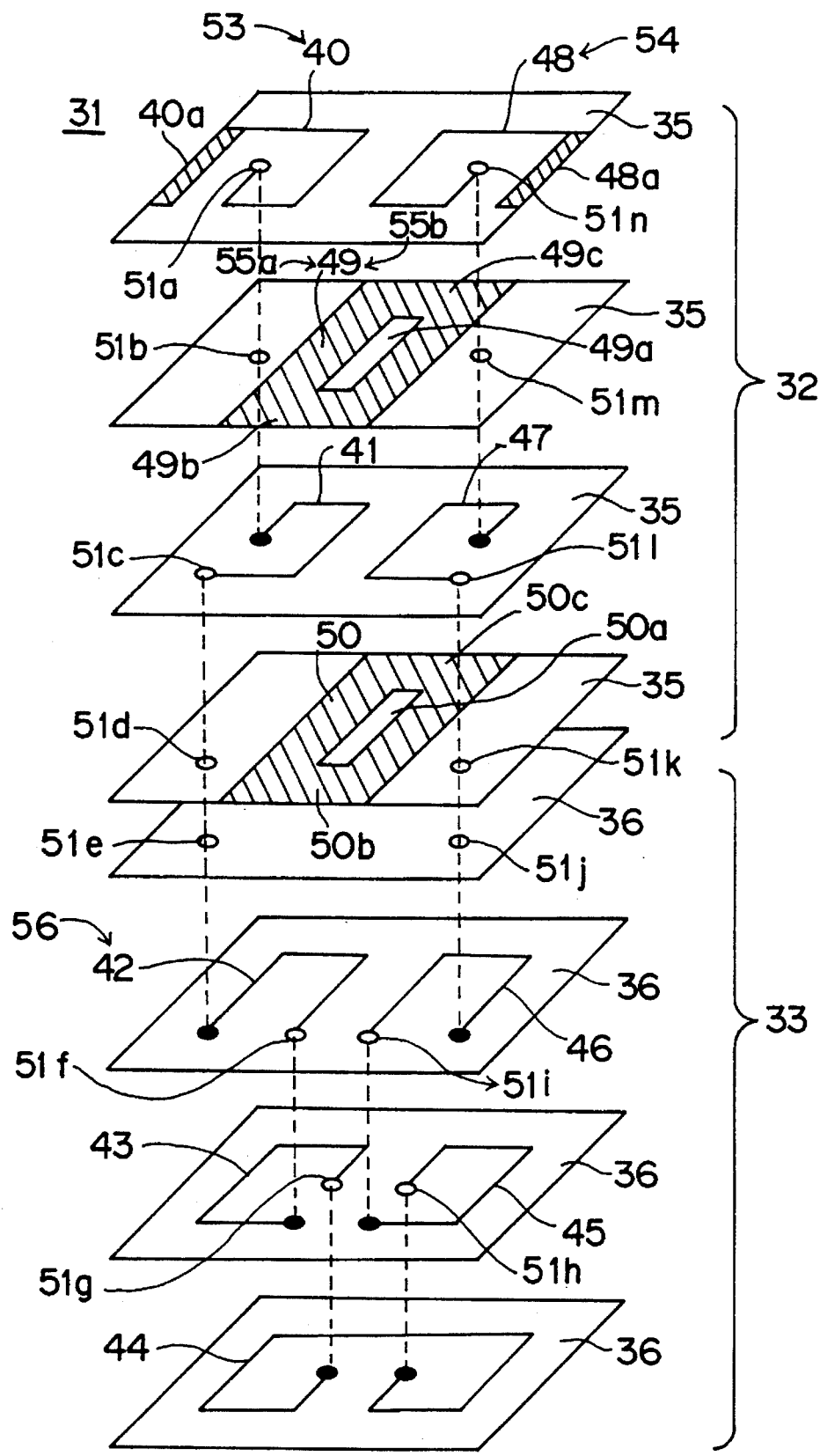
FIG. 5 is an exploded perspective view of a laminate type LC composite device which is a second embodiment of the present invention.

A second embodiment is a π type low-pass filter 31. As shown in FIG. 5, the filter 31 has a capacitor section 32 and an inductor section 33. The capacitor section 32 comprises a plurality of insulating sheets 35, and capacitor conductors 49 and 50 and micro coil conductors 40, 41, 47 and which are provided on the insulating sheets 35. The insulating sheets 35 are made of a material with a low magnetic permeability. The micro coil conductors 40 and 48 are provided on the same insulating sheet 35. The micro coil conductors 40 extends a leading portion 40a to the left edge of the insulating sheet 35, and the micro coil conductors 48 extends a leading portion 40b to the right edge of the insulating sheet 35. The capacitor conductors 49 and 50 have rectangular center holes 49a and 59a respectively. The capacitor conductor 49 extends leading portions 49b and 49c respectively to the front edge and the rear edge of an insulating sheet 35. The capacitor conductor 50 extends leading portions 50b and 50c respectively to the front edge and the rear edge of an insulating sheet 35.

The inductor section 33 comprises a plurality of insulating sheets 36, and coil conductors 42, 43, 44, 45 and 46 which are provided on the insulating sheets 36. The insulating sheets 36 are made of a material with a high magnetic permeability. The insulating sheets 35 and 36 have via holes 51a through 51n.

The insulating sheets 35 and 36 which have the conductors 40 through 50 thereon, and a protective insulating sheet (not shown) are laminated and sintered. In the laminate structure, the micro coil conductors 40 and 41 are connected in series by the via holes 51a and 51b to form a spiral micro coil 53, and the micro coil conductors 47 and 48 are connected in series by the via holes 51m and 51n to form a spiral micro coil 54. Each of the micro coils 53 and 54 has an inductance of $L_4$. The coil conductors 42 through 46 are connected in series by the via holes 51f through 51i to form a spiral coil 56 with an inductance of $L_3$. The inductances $L_4$ of the micro coils 53 and 54 and the inductance $L_3$ of the coil 56 fulfill the following condition:

$$L_3C_5 > L_4C_6 \quad (2)$$

$C_5$: stray capacitance of the coil 56

$C_6$: stray capacitances of the micro coils 53 and 54

The capacitor conductors 49 and 50 and the micro coil conductors 40 and 41 form a capacitor 55a with a capacitance of $C_4$, and the capacitor conductors 49 and 50 and the micro coil conductors 47 and 48 form a capacitor 55b with a capacitance of $C_4$. Since the capacitor conductors 49 and 50 have the center holes 49a and 50a, magnetic paths of the micro coils 53 and 54 are formed in the capacitor conductors 49 and 50. The micro coil 53 is connected to the coil 56 in series by the via holes 51c through 51e, and the micro coil 54 is connected to the coil 56 in series by the via holes 51j through 51l.

Figure 6:
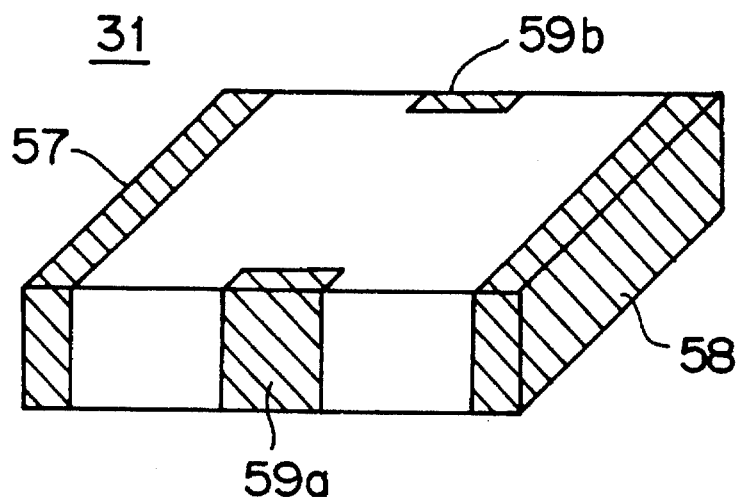
FIG. 6 is a perspective view of the laminate type LC composite device of FIG. 5.

As shown in FIG. 6, the filter 31 is provided with an input electrode 57 on the left end and an output electrode 58 on the right end. Further, grounding electrodes 59a and 59b are provided on the front end and the rear end. The input electrode 57 is electrically connected to the leading portion 40a of the micro coil conductor 40, and the output electrode 58 is electrically connected to the leading portion 48a of the micro coil conductor 48. The grounding electrode 59a is electrically connected to the leading portions 49b and 50b of the capacitor conductors 49 and 50, and the grounding electrode 59b is electrically connected to the leading portions 49c and 50c of the capacitor conductors 49 and 50.

Figure 7:
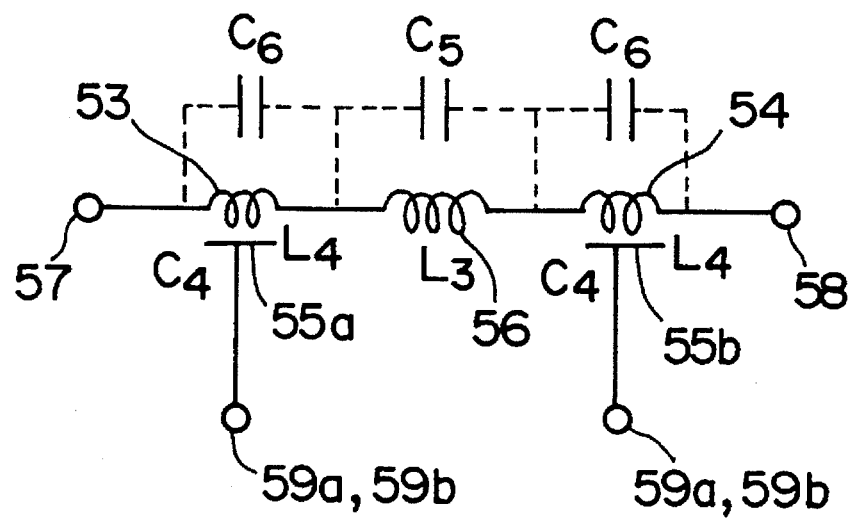
FIG. 7 is an electric equivalent circuit diagram of the laminate type LC composite device of FIG. 6.

FIG. 7 shows the electrical equivalent circuit of the filter 31. Between the input electrode 57 and the output electrode 58, the coil 56 and the micro coils 53 and 54 are connected in series, and the capacitors 55a and 55b are connected in parallel. A stray capacitance $C_5$ is generated in parallel with the coil 56, and stray capacitances $C_6$ are generated in parallel with the micro coils 53 and 54.

The inductance $L_3$ and the stray capacitance $C_5$ of the coil 56 resonate at a resonance frequency of $f_1$. The inductance $L_4$ and the stray capacitance $C_6$ of the micro coil 53, and the inductance $L_4$ and the stray capacitance $C_6$ of the micro coil 54 resonate respectively at a resonance frequency of $f_2$.

Because of the condition of the expression (2), the resonance frequency $f_2$ is higher than the resonance frequency $f_1$. In a frequency area under the resonance frequency $f_1$, the coil 56 functions to eliminate noise, and in a frequency area having frequencies above the resonance frequency $f_1$, the micro coils 53 and 54 function to eliminate noise. Thus, the filter 31 has better high-frequency characteristics than conventional LC composite devices.

FIG. 8 shows the insertion loss characteristic of the filter 31. The solid line 60a shows the insertion loss characteristic of the filter 31, wherein the inductance $L_3$ of the coil 56 is 318 nH, the inductances $L_4$ of the micro coils 53 and 54 are 10 nH, the capacitances $C_4$ of the capacitors 55a and 55b are 64 pF, the stray capacitance $C_5$ of the coil 56 is 1 pF, and the stray capacitances $C_6$ of the micro coils 53 and 54 are 1 pF. For comparison, the dashed line 60b shows the insertion loss characteristic of a conventional filter, wherein the micro coils 53 and 54 are not provided, and accordingly the stray capacitances $C_6$ are not generated.

The resonance frequency $f_2$ of the inductances $L_4$ and the stray capacitances $C_6$ of the micro coils 53 and 54 is higher than the resonance frequency $f_1$ of the inductance $L_3$ and the stray capacitance $C_5$ of the coil 56. As is apparent from FIG. 8, in a high-frequency area, the filter 31 has a larger insertion loss than conventional filters and is better in the noise elimination function.

Third Embodiment: FIGS. 9–14

Figure 9:
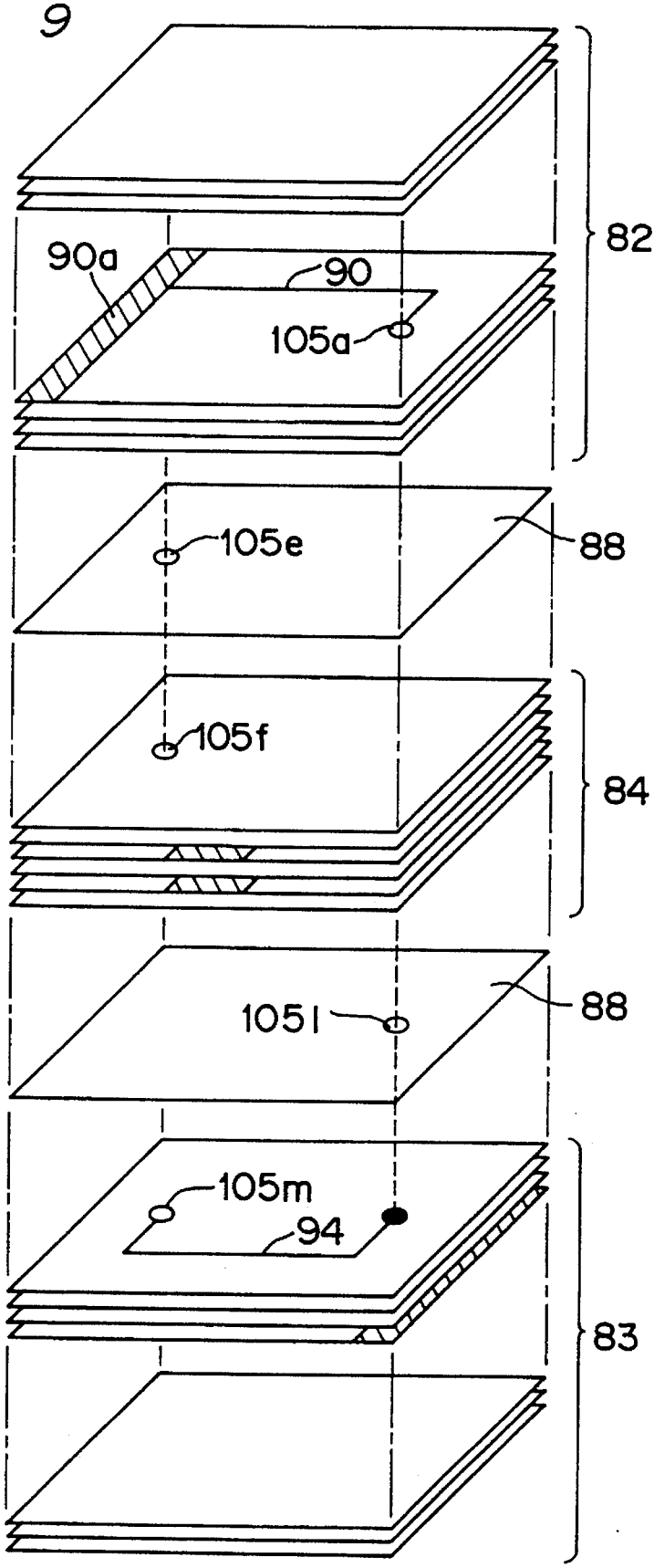
FIG. 9 is an exploded perspective view of a laminate type LC composite device which is a third embodiment of the present invention.

A third embodiment is a T type low-pass filter 81. As shown in FIG. 9, the filter 81 has a capacitor section 84 between inductor sections 82 and 83, internal insulating sheets 88 being provided thereamong. The internal insulating sheets 88 are to prevent delamination during sintering and fusion of different materials. Therefore, the internal insulating sheets 88 are preferably made of a mixture of the material of the inductor sections 82 and 83 and the material of the capacitor section 84. The internal insulating sheets 88 have via holes 105e and 105l.

Figure 10:
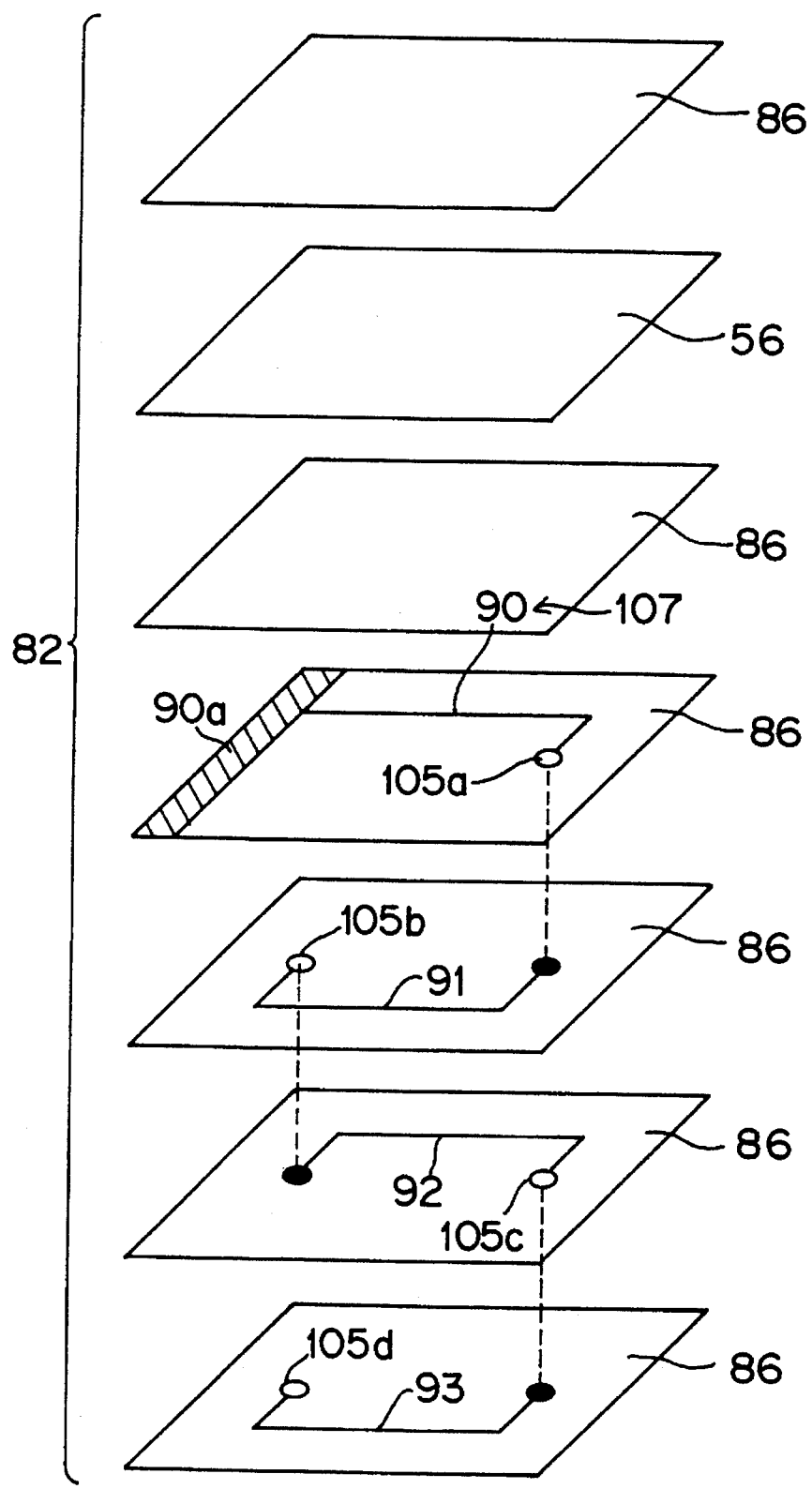
FIG. 10 is an exploded perspective view of an inductor section of the laminate type LC composite device of FIG. 9.

FIG. 10 shows the inductor section 82. The inductor section 82 comprises a plurality of insulating sheets 86, and coil conductors 90, 91, 92 and 93 which are provided on the insulating sheets 86. The insulating sheets 86 are made of a material with a high magnetic permeability. The coil conductor 90 extends a leading portion 90a to the left edge of an insulating sheet 86. The insulating sheets 86 have via holes 105a through 105d. Insulating sheets 86 with no conductors thereon are used as protective sheets. When the insulating sheets 86 with the coil conductors 90 through 93 thereon and the protective sheets 86 are laminated, the coil conductors 90 through 93 are connected in series by the via holes 105a through 105c to form a spiral coil 107 with an inductance of $L_5$.

Figure 11:
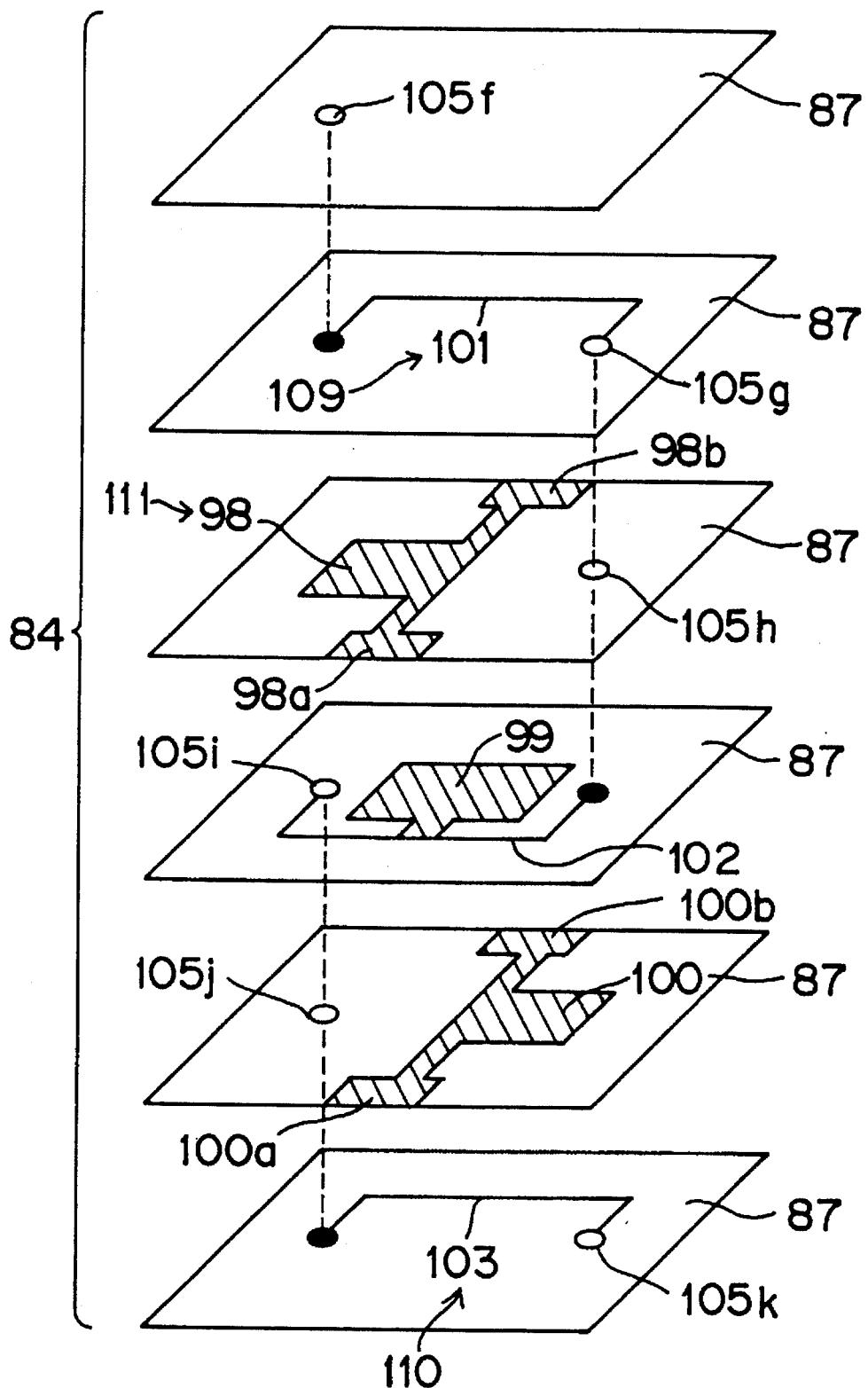
FIG. 11 is an exploded perspective view of a capacitor section of the laminate type LC composite device of FIG. 9.

FIG. 11 shows the capacitor section 84. The capacitor section 84 comprises a plurality of insulating sheets 87, capacitor conductors 98, 99 and 100 and micro coil conductors 101, 102 and 103 which are provided on the insulating sheets 87. The insulating sheets 87 are made of a material with a low magnetic permeability. The capacitor conductor 98 extends leading portions 98a and 98b respectively to the front edge and to the rear edge of an insulating sheet 87. The capacitor conductor 100 extends leading portions 100a and 100b respectively to the front edge and to the rear edge of an insulating sheet 87. The capacitor conductor 99 and the micro coil conductor 102 are on an insulating sheet 87, and the capacitor conductor 99 is in contact with the central portion of the micro coil conductor 102. The insulating sheets 87 have via holes 105f through 105k.

When the insulating sheets 87 are laminated, the micro coil conductors 101 through 103 are connected in series by the via holes 105g through 105j. The micro coil conductor 101 and the right half of the micro coil conductor 102 form a micro coil 109, and the micro coil conductor 103 and the left half of the micro coil conductor 102 form a micro coil 110. Each of the micro coils 109 and 110 has an inductance of $L_6$. The capacitor conductors 98 through 100 form a capacitor 111 with a capacitance of $C_7$.

Figure 12:
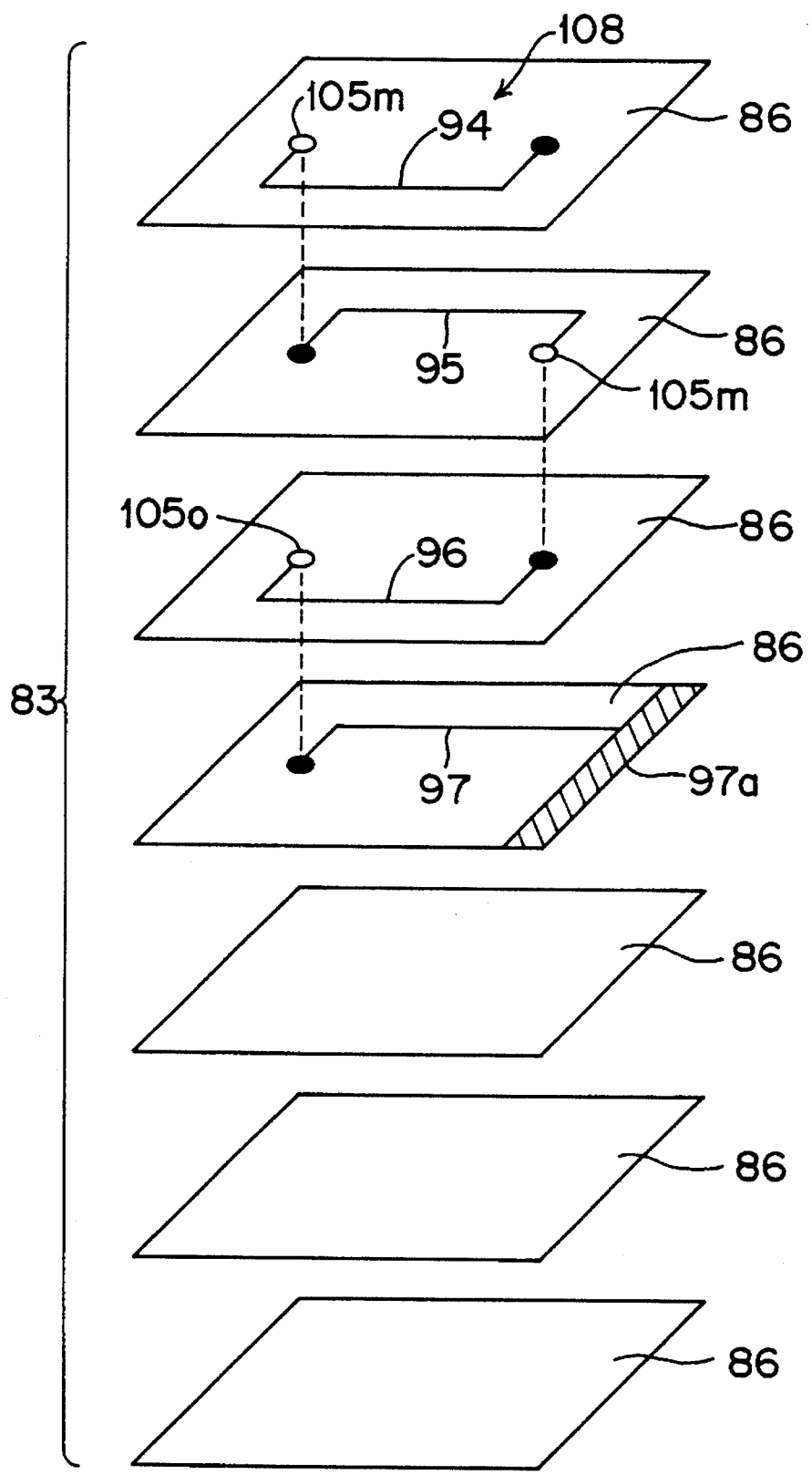
FIG. 12 is an exploded perspective view of another inductor section of the laminate type LC composite device of FIG. 9.

FIG. 12 shows the inductor section 83. The inductor section 83 comprises a plurality of insulating sheets 86, and coil conductors 94, 95, 96 and 97 which are provided on the insulating sheets 86. The coil conductor 97 extends a leading portion 97a to the right edge of an insulating sheets 86. The insulating sheets 86 have via holes 105m through 105o. Insulating sheets 86 with nothing thereon are used as protective sheets. When these insulating sheets 86 are laminated, the coil conductors 94 through 97 are connected in series by the via holes 105m through 105o to form a spiral coil 108 with an inductance of $L_5$.

The insulating sheets 86 and 87 which have the conductors 90 through 103 thereon, the internal insulating sheets 88 and the protective sheets 86 are laminated and sintered. The inductances $L_5$ of the coils 107 and 108 and the inductances $L_6$ of the micro coils 109 and 110 fulfill the following condition:

$$L_5 C_8 > L_6 C_9 \tag{3}$$

$C_8$: stray capacitances of the coils 107 and 108

$C_9$: stray capacitances of the micro coils 109 and 110

The coil 107 is connected to the micro coil 109 in series by the via holes 105d through 105f, and the coil 108 is connected to the micro coil 110 in series by the via holes 105k through 105m.

Figure 13:
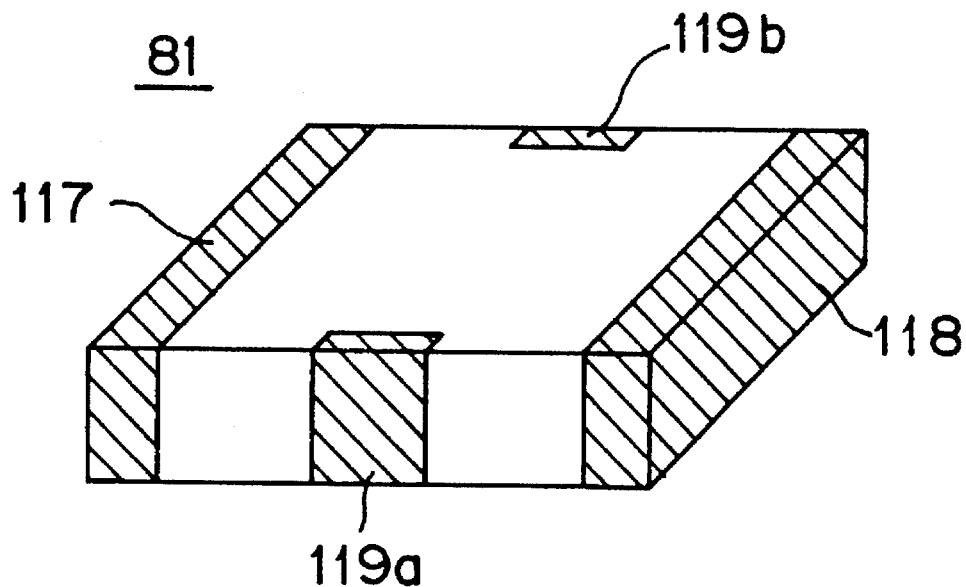
FIG. 13 is a perspective view of the laminate type LC composite device of FIG. 9.

As shown in FIG. 13, the filter 81 is provided with an input electrode 117 and an output electrode 118 on the left end and on the right end respectively. Further, grounding electrodes 119a and 119b are provided on the front end and the rear end. The input electrode 117 is electrically connected to the leading portion 90a of the coil conductor 90, and the output electrode 118 is electrically connected to the leading portion 97a of the coil conductor 97. The ground electrode 119a is electrically connected to the leading portions 98a and 100a of the capacitor conductors 98 and 100, and the grounding electrode 119b is electrically connected to the leading portions 98b and 100b of the capacitor conductors 98 and 100. The electrodes 117 through 119b can be made by coating, sputtering, ion plating or vapor deposition of Ag, Ag—Pd or the like.

Figure 14:
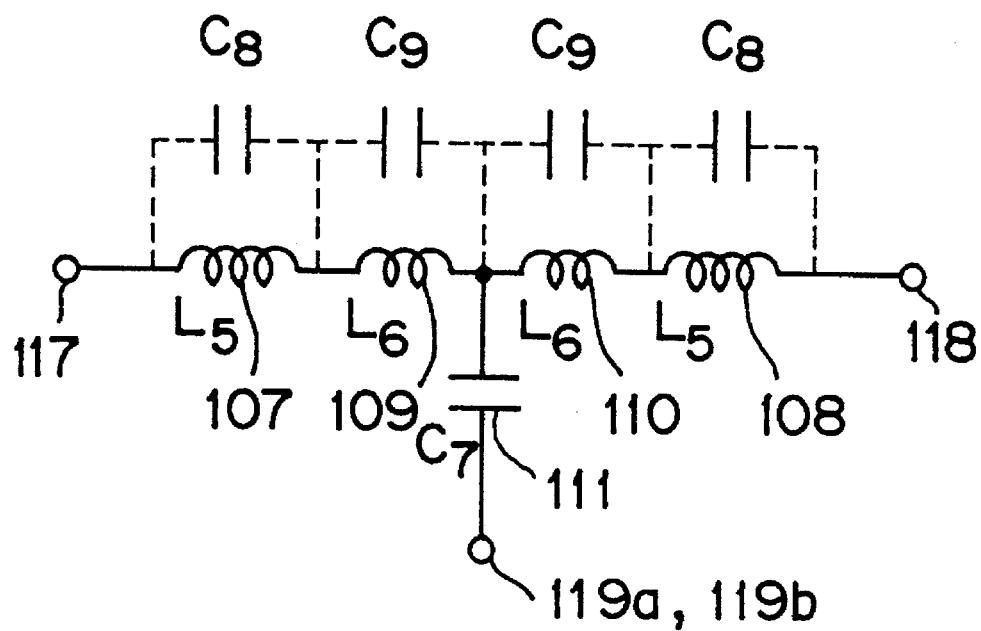
FIG. 14 is an electric equivalent circuit diagram of the laminate type LC composite device of FIG. 13.
Figure 15:
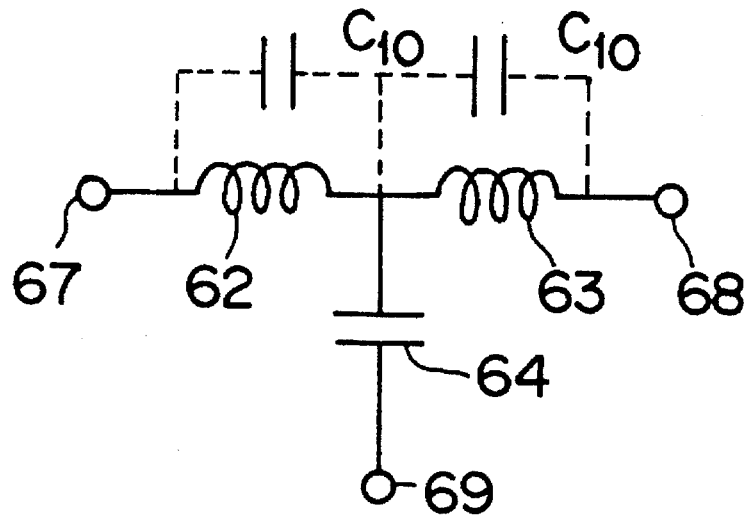
FIG. 15 is an electric equivalent circuit diagram of a conventional laminate type LC composite device.
Figure 16:
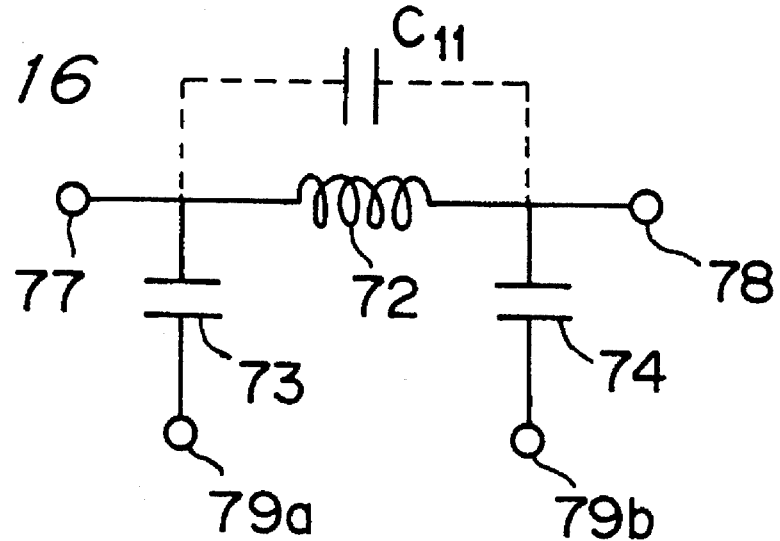
FIG. 16 is an electric equivalent circuit diagram of another conventional laminate type LC composite device.

FIG. 14 shows the electric equivalent circuit of the filter 81. Between the input electrode 117 and the output electrode 118, the coils 107 and 108 and the micro coils 109 and 110 are connected in series, and the capacitor 111 is connected in parallel. Stray capacitances $C_8$ are generated in parallel with the coils 107 and 108, and stray capacitances $C_9$ are generated in parallel with the micro coils 109 and 110.

The inductance $L_5$ and the stray capacitance $C_8$ of the coil 107, and the inductance $L_5$ and the stray capacitance $C_8$ of the coil 108 resonate at a resonance frequency of $f_1$. The inductance $L_6$ and the stray capacitance $C_9$ of the micro coil 109, and the inductance $L_2$ and the stray capacitance $C_9$ of the micro coil 110 resonate at a resonance frequency of $f_2$.

Since the inductances $L_5$ and $L_6$ and the stray capacitances $C_8$ and $C_9$ have a relation of the expression (3), the resonance frequency $f_2$ is higher than the resonance frequency $f_1$. In a frequency area under the resonance frequency $f_1$, the coils 107 and 108 function to eliminate noise, and in a frequency area having frequencies above the resonance frequency $f_2$, the micro coils 109 and 110 function to eliminate noise. Thus, the filter 81 has better high-frequency characteristics than conventional LC composite devices.

Other Embodiments

The present invention is applicable to L type LC composite devices as well as T type and π type LC composite devices.

In the above embodiments, the insulating sheets of the inductor sections and those of the capacitor sections are made of different materials, but they can be made of the same material.

Although the LC composite devices of the above embodiments are made by laminating the insulating sheets and sintering the laminate body, other producing methods are possible. For example, the following method can be adopted. Paste of an insulating material is coated and dried into an insulating film, and on the insulating film, a coil conductor, a micro coil conductor and/or a capacitor conductor are formed. A laminate body is formed by repeating the coating, and the laminate body is sintered.

Although the present invention has been described connection with the preferred embodiments above, it is to be noted that various changes and modifications are possible to those who are skilled in the art. Such changes and modifications are to be understood as being within the scope of the present invention.

What is claimed is:

1. A laminate type LC composite device having a laminate structure comprising:

an input electrode and an output electrode;

a coil which is electrically connected in series between the input electrode and the output electrode, the coil being a laminate of first insulators and coil conductors, said coil having an inductance of L and a stray capacitance of C;

at least one capacitor which is a laminate of second insulators and capacitor conductors, said at least one capacitor being electrically connected between the coil and a grounding electrode; and a micro coil which is incorporated in the laminate of the second insulators and the capacitor conductors, said micro coil being electrically connected to the coil in series, the micro coil having an inductance of L' and a stray capacitance of C';

wherein the inductance L and the stray capacitance C of the coil and the inductance L' and the stray capacitance C' of the micro coil fulfill the following condition:

$LC > L'C'$.

2. A laminate type LC composite device as claimed in claim 1, wherein:

the first insulators are made of a material with a high magnetic permeability; and the second insulators are made of a material with a low magnetic permeability.

3. A laminate type LC composite device as claimed in claim 1, wherein:

the coil conductors are connected to each other in series by via holes made in the first insulators.

4. A laminate type LC composite device as claimed in claim 1, wherein said device is formed as a T type filter which comprises an additional coil electrically connected in series between the input electrode and the output electrode, an additional micro coil electrically connected to said additional coil in series, and one capacitor.

5. A laminate type LC composite device as claimed in claim 1, wherein said device is formed as a π type filter which comprises an additional micro coil electrically connected in series between the input electrode and the output electrode, and an additional capacitor electrically connected in parallel between the input electrode and the output electrode.

6. A laminate type LC composite device as claimed in claim 1, wherein:

the first insulators and the second insulators are insulating sheets.

7. A laminate type LC composite device as claimed in claim 6, wherein:

the micro coil is formed of micro coil conductors which are provided on the second insulating sheets and connected to each other in series by via holes made in the second insulating sheets.

8. A laminate type LC composite device as claimed in claim 7, wherein:

at least one of the micro coil conductors and one of the capacitor conductors are provided on an insulating sheet and connected to each other.

9. A laminate type LC composite device having a laminate structure comprising:

an input electrode and an output electrode;

a coil which is electrically connected in series between the input electrode and the output electrode, the coil being formed of coil conductors provided on laminated insulating sheets, the coil having an inductance of L and a stray capacitance of C;

at least one capacitor which is electrically connected between the coil and a grounding electrode, the at least one capacitor being formed of capacitor conductors provided on laminated insulating sheets; and a micro coil which is electrically connected to the coil in series, the micro coil being provided on one of the insulating sheets which have the capacitor conductors thereon, the micro coil having an inductance of L' and a stray capacitance of C';

wherein the inductance L and the stray capacitance C of the coil and the inductance L' and the stray capacitance C' of the micro coil fulfill the following condition:

$LC > L'C'$.

10. A laminate type LC composite device as claimed in claim 9, wherein:

the insulating sheets which have the coil conductors thereon are made of a material with a high magnetic permeability; and the insulating sheets which have the capacitor conductors thereon are made of a material with a low magnetic permeability.

11. A laminate type LC composite device as claimed in claim 9, wherein:

the coil is spiral and formed of the coil conductors which are provided on the insulating sheets and are electrically connected to each other in series by via holes made in the insulating sheets; and the micro coil is snaking.

12. A laminate type LC composite device as claimed in claim 9, being a T type filter which comprises an additional coil electrically connected in series between the input electrode and the output electrode, an additional micro coil electrically connected to said additional coil in series, and one capacitor.

13. A laminate type LC composite device having a laminate structure comprising:

an input electrode and an output electrode;

a coil which is electrically connected in series between the input electrode and the output electrode, the coil being a laminate of coil conductors and insulating sheets, said insulating sheets being made of a material with a high magnetic permeability, the coil having an inductance of L and a stray capacitance of C;

at least one capacitor which is electrically connected between the coil and a grounding electrode, the at least one capacitor being a laminate of capacitor conductors and insulating sheets; and a micro coil which is electrically connected to the coil in series, the micro coil being a laminate of micro coil conductors and insulating sheets, the insulating sheets which have the capacitor conductors thereon and the insulating sheets which have the micro conductors thereon being made of a material with a low magnetic permeability, the micro coil having an inductance of L' and a stray capacitance of C';

wherein the inductance L and the stray capacitance C of the coil and the inductance L' and the capacitance C' of the micro coil fulfill the following condition:

$LC > L'C'$.

14. A laminate type LC composite device as claimed in claim 13, wherein:

the coil conductors are electrically connected in series by via holes made in the insulating sheets; and the micro coil conductors are electrically connected in series by via holes made in the insulating sheets.

15. A laminate type LC composite device as claimed in claim 13, being a π type filter which includes an additional micro coil electrically connected in series between the input electrode and the output electrode, and an additional capacitor electrically connected in parallel between the input electrode and the output electrode.

* * * * *